United States Patent
Schweitzer et al.

(10) Patent No.: US 11,385,435 B2
(45) Date of Patent: Jul. 12, 2022

(54) ATHERMAL LASER OPTICS MADE OF PLASTICS

(71) Applicant: JENOPTIK Optical Systems GmbH, Jena (DE)

(72) Inventors: Hagen Schweitzer, Schleiz (DE); Jan Buchwald, Jena (DE); Alexander Dycke, Hermsdorf (DE); Joachim Leuschner, Jena (DE)

(73) Assignee: Jenoptik Optical Systems GmbH, Jena (DE)

( * ) Notice: Subject to any disclaimer, the term of this patent is extended or adjusted under 35 U.S.C. 154(b) by 0 days.

(21) Appl. No.: 17/426,432

(22) PCT Filed: Jan. 15, 2020

(86) PCT No.: PCT/EP2020/050886
§ 371 (c)(1),
(2) Date: Jul. 28, 2021

(87) PCT Pub. No.: WO2020/156810
PCT Pub. Date: Aug. 6, 2020

(65) Prior Publication Data
US 2021/0389548 A1 Dec. 16, 2021

(30) Foreign Application Priority Data
Jan. 30, 2019 (DE) .................. 10 2019 102 268.1
Mar. 20, 2019 (DE) .................. 10 2019 107 146.1

(51) Int. Cl.
*H01S 5/02253* (2021.01)
*H01S 3/04* (2006.01)
(Continued)

(52) U.S. Cl.
CPC .............. *G02B 7/028* (2013.01); *G02B 3/04* (2013.01); *G02B 19/0014* (2013.01);
(Continued)

(58) Field of Classification Search
CPC ...... G02B 7/028; G02B 3/04; G02B 19/0014; G02B 19/0052; H01S 3/04; H01S 5/0014; H01S 5/02253
See application file for complete search history.

(56) References Cited

U.S. PATENT DOCUMENTS 4,720,168 A 1/1988 Kaneko
4,861,137 A 8/1989 Nagata
(Continued)

FOREIGN PATENT DOCUMENTS

DE 10 2006 023 945 A1 11/2007
DE 11 2006 002 396 T5 7/2008
(Continued)

OTHER PUBLICATIONS

German Office Action for German Application No. 10 2019 107 146.1 dated Feb. 19, 2020—English translation.

*Primary Examiner* — Yuanda Zhang
(74) *Attorney, Agent, or Firm* — Muncy, Geissler, Olds & Lowe, P.C.

(57) ABSTRACT

The invention relates to an athermalized device for generating laser radiation that is focused in a focal point, comprising a lens and a plastic housing and a passive adjustment system for adjusting the object distance S1. The passive adjustment device has an effective coefficient of thermal expansion (I)

$$\alpha_V = \frac{s_1}{f} \cdot \left[\alpha_L - \frac{1}{n-1} \cdot \left(\frac{\partial n}{\partial \lambda} \cdot \frac{d\lambda}{dT} + \frac{\partial n}{\partial T}\right)\right] + \alpha_2 \cdot \left(1 - \frac{s_1}{f}\right).$$

8 Claims, 1 Drawing Sheet

(51) Int. Cl.
*G02B 7/02* (2021.01)
*G02B 3/04* (2006.01)
*G02B 19/00* (2006.01)
*H01S 5/00* (2006.01)

(52) U.S. Cl.
CPC ............ *G02B 19/0052* (2013.01); *H01S 3/04* (2013.01); *H01S 5/0014* (2013.01); *H01S 5/02253* (2021.01)

(56) References Cited

U.S. PATENT DOCUMENTS

| | | | |
|---|---|---|---|
| 5,013,001 A | 5/1991 | Liese | |
| 5,210,650 A * | 5/1993 | O'Brien | G02B 7/008 |
| | | | 385/33 |
| 5,270,869 A * | 12/1993 | O'Brien | G02B 27/09 |
| | | | 385/33 |
| 5,283,695 A | 2/1994 | Ziph-Schatzberg et al. | |
| 5,313,333 A * | 5/1994 | O'Brien | G02B 7/028 |
| | | | 359/811 |
| 5,410,563 A | 4/1995 | Nakamura et al. | |
| 6,208,448 B1 | 3/2001 | Shibata | |
| 6,292,312 B1 | 9/2001 | Broome | |
| 6,650,412 B1 | 11/2003 | Slater | |
| 7,680,161 B2 | 3/2010 | Takahashi | |
| 2015/0241268 A1* | 8/2015 | Buchwald | C23C 14/221 |
| | | | 250/226 |

FOREIGN PATENT DOCUMENTS

| | | | | |
|---|---|---|---|---|
| DE | 102008047277 A1 * | 4/2010 | ........... | G02B 13/001 |
| EP | 0 313 970 A1 | 5/1989 | | |
| EP | 0 564 376 A1 | 10/1993 | | |
| EP | 2 932 113 A2 | 7/1999 | | |
| GB | 2 254 959 A | 10/1992 | | |
| JP | 20113857 A | 1/2011 | | |
| JP | 2013138086 A | 7/2013 | | |
| KR | 1020160145910 | 12/2016 | | |

* cited by examiner

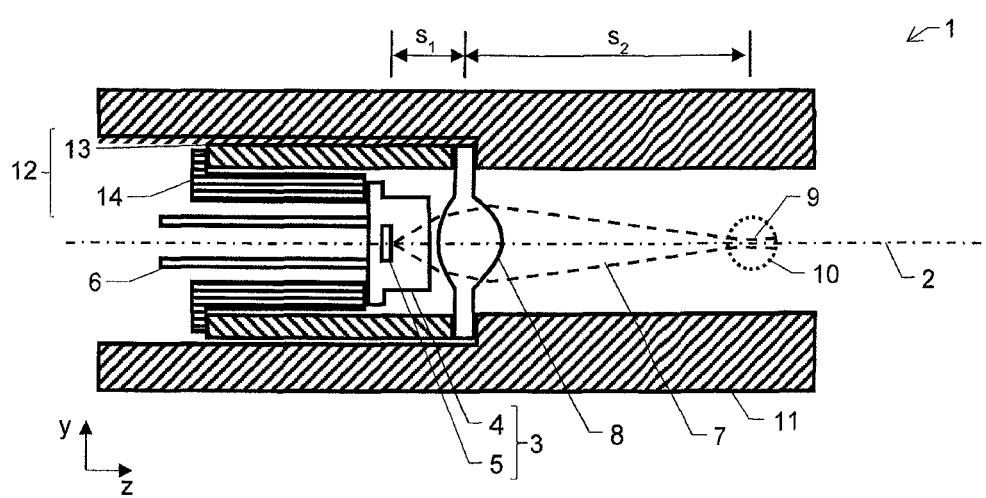

ATHERMAL LASER OPTICS MADE OF PLASTICS

This nonprovisional application is a National Stage of International Application No. PCT/EP2020/050886, which was filed on Jan. 15, 2020, and which claims priority to German Patent Application No. 10 2019 102 268.1, which was filed in Germany on Jan. 30, 2019 and German Patent Application No. 10 2019 107 146.1, which was filed in Germany on Mar. 20, 2019, and which are all herein incorporated by reference.

BACKGROUND OF THE INVENTION

Field of the Invention

The invention relates to the athermalization of a device for generating laser radiation concentrated to a focal point.

Description of the Background Art

DE112006002396 discloses temperature-compensated laser focusing optics in which a spacer having a low coefficient of thermal expansion is provided between the laser source and the focusing lens. Such an arrangement enables a reduction in temperature dependence, but not compensation of the temperature dependence of the focal position.

U.S. Pat. No. 6,650,412 discloses temperature compensation for an optical device by means of flexural elements. Such an arrangement requires costly metal components.

EP0932113 discloses a wavelength-dependent thermally compensated optical system having a focusing lens made of plastic. What is proposed here is a diffractive optical element disposed in the beam path downstream of the focusing lens, with which the thermal change in the focal length of the lens is compensated. U.S. Pat. No. 5,410,563 discloses an arrangement with which a laser beam is collimated by means of a lens and a Fresnel lens.

Diffractive elements and Fresnel lenses disadvantageously have poor efficiency. Moreover, back-reflections can occur at the diffractive element, which can disrupt the laser resonator.

U.S. Pat. No. 6,292,312 discloses athermalized lens holders. As an alternative to known tube arrangements composed of concentric tubes of different extent, elements with an inclined outer cone shell are recommended. Such elements may be nonlinear and permit compensation within a restricted temperature range.

EP0564376 discloses an athermalized collimation in which the effect of a compensation ring can be enhanced by leverage on a flexure plate mounted on flexure bearings. For this purpose, complicated flexure bearings are required.

GB2254959 discloses the athermalization of a collimation lens of a laser by means of two concentric sleeves having different coefficients of thermal expansion. This compensation neglects the temperature dependence of the laser wavelength. Moreover, the thermal expansion of the housing material is not taken into account. Therefore, compensation is possible only within a restricted temperature range.

EP0318970 discloses a laser element with a temperature-compensated collimator.

U.S. Pat. No. 4,861,137 discloses a lens holder with bimetallic elements in order to compensate for the temperature dependence of one of the focal length plastic lenses.

U.S. Pat. No. 4,720,168 discloses correcting the focal length with regard to the wavelength dependence of a laser in conjunction with the dispersion of the focal lens.

Ali H. Al-Hamdani and Raghad I. Ibrahim, *Athermalization of Optical Systems in Infrared*, International Journal of Current Engineering and Technology, vol. 5, no. 5 3162-3165 (2015), discloses moving the focal plane by means of a combination of elements having different coefficients of thermal expansion disposed behind the focal plane along the optical axis, in order to compensate for the temperature dependence of the lens.

SUMMARY OF THE INVENTION

It is an object of the invention to specify an inexpensive device for generating laser radiation concentrated to a focal point, which is operable over a wide temperature range.

The device of the invention for generating laser radiation concentrated to a focal point is producible inexpensively and operable over a wide temperature range. It is advantageous that only a single lens made of a plastic is required for the device. It is possible to dispense with having to use a costly glass lens or achromatic lens combination.

The object is achieved by an inexpensive device for generating laser radiation concentrated to a focal point as claimed in claim 1, and use as claimed in claim 8.

The device (1) for generating laser radiation concentrated to a focal point (6) comprises
a laser diode (3) having a central wavelength $\lambda$ and a temperature dependence of the central wavelength $$\frac{d\lambda}{dT},$$

a lens (8) having a focal length f, made of a first plastic having a refractive index n, a wavelength dependence of the refractive index $$\frac{\partial n}{\partial \lambda},$$

a temperature dependence of the refractive index $$\frac{\partial n}{\partial T}$$

and a coefficient or thermal expansion $\alpha_L$, wherein the lens results in an optical image of the laser radiation at the focal point (9) and the optical image has an object distance $s_1$,
a housing (11) made of a second plastic having a coefficient of thermal expansion $\alpha_2$
a passive adjustment device (12) having an effective coefficient of thermal expansion $\alpha_V$ for adjustment of the object distance $s_1$, wherein the effective coefficient of thermal expansion is $$\alpha_V = \frac{s_1}{f} \cdot \left[\alpha_L - \frac{1}{n-1} \cdot \left(\frac{\partial n}{\partial \lambda} \cdot \frac{d\lambda}{dT} + \frac{\partial n}{\partial T}\right)\right] + \alpha_2 \cdot \left(1 - \frac{s_1}{f}\right).$$

The focal point may, but need not, lie on the optical axis. The focal point, for the purposes of geometric radiation optics, may be considered as a point of intersection of the convergent light rays diffracted by the lens. From the point of view of wave optics, the focal point may be a Gaussian beam waist, i.e. the waist of a Gaussian beam.

The first plastic may advantageously be a transparent plastic, for example polystyrene (PS), polyethylene terephthalate (PET), polyallyldiglycol carbonate (PADC), polycarbonate (PC), polymethylmethacrylate (PMMA), a cycloolefin polymer (COP) or a synthetic resin, for example phenolic resin, urea resin, melamine resin, polyester resin or epoxy resin.

The second plastic may advantageously be, for example, PS, PVC, PET, PADC, PC, PMMA, PEEK, PE, PP, COP, polysulfone (PSU) or a synthetic resin, for example phenolic resin, urea resin, melamine resin, polyester resin or epoxy resin. The second plastic may have been modified to absorb light and/or colored with the aid of admixtures, for example carbon or dye. Likewise advantageously, the second plastic may have been fiber-reinforced.

The device may have a transfer matrix $M=M_{s2}M_LM_{s1}$, where the indices may each range from 0 to 1. It may be the case here that $$M_{s2} = \begin{pmatrix} 1 & s_2 \\ 0 & 1 \end{pmatrix}$$

is the transfer matrix of the free beam after the lens, $$M_{s1} = \begin{pmatrix} 1 & s_1 \\ 0 & 1 \end{pmatrix}$$

is the transfer matrix of the free beam before the lens and $$M_L = \begin{pmatrix} 1 & 0 \\ -1/f & 1 \end{pmatrix}$$

is the transfer matrix of the lens, reported here in the customary approximation of a thin lens. The image distance $s_2$ may have the temperature dependence $\alpha_2$ of the housing material. This can mean that a target focal point position moves, or is intended to move, along the optical axis with the thermal expansion of the housing. The focal length f of the lens may be dependent on three thermal influencing parameters. On the basis of the coefficient of thermal expansion $\alpha_L$ in the event of a change in temperature, there can be a change in the shape of the lens, which alters the focal length. As a result of the temperature dependence of the refractive index $$\frac{\partial n}{\partial T},$$

there can be a change in the focal length. Moreover, the wavelength of the laser, i.e. the central wavelength of the laser radiation, can change with the change in temperature owing to the temperature dependence $$\frac{d\lambda}{dT}.$$

On account of the wavelength dependence of the refractive index $$\frac{\partial n}{\partial \lambda}$$

of the lens, there may thus likewise be a change in the focal length of the lens.

First-order development of the transfer matrix to a series gives $$M(T) = M(T_0) + \Delta T \cdot \frac{d}{dT} M$$

with a reference temperature $T_0$ and a temperature variance $\Delta T$ from the reference temperature. The derivation of the transfer matrix is $$\frac{d}{dT}M = \frac{\partial M}{\partial s_1} \cdot \frac{ds_1}{dT} + \frac{\partial M}{\partial s_2} \cdot \frac{ds_2}{dT} + \frac{\partial M}{\partial f} \cdot f \cdot \left[ \frac{-1}{n-1} \cdot \left( \frac{\partial n}{\partial T} + \frac{\partial n}{\partial \lambda} \cdot \frac{d\lambda}{dT} \right) + \alpha_L \right]$$

with the effective coefficient of thermal expansion of the adjustment device $$\frac{ds_1}{dT} = \alpha_V$$

and $$\frac{ds_2}{dT} = \alpha_2$$

Under the condition that the zeroth index of the transformed beam vector in the plane of the image at the reference temperature and any angles φ of a beam relative to the optical axis within an aperture of the optical system is zero, $$\left[ M(T_0) \cdot \begin{pmatrix} 0 \\ \varphi \end{pmatrix} \right]_0 = 0$$

the imaging condition at the reference temperature is obtained:

$$s_2(T_0) = \frac{s_1(T_0)}{\frac{s_1(T_0)}{f} - 1}$$

The imaging condition should likewise be applicable at a different temperature $$\left[ M(T_0 + \Delta T) \cdot \begin{pmatrix} 0 \\ \varphi \end{pmatrix} \right]_0 = 0$$

and in the imaging plane that has now moved $$s_2(T) = s_2(T_0) \cdot (1 + \alpha_2 \cdot \Delta T)$$

For this purpose, it must be the case that $$\left[\frac{d}{dT} M \cdot \begin{pmatrix} 0 \\ \varphi \end{pmatrix}\right]_0 = 0$$

The calculation of the above expression leads to the required effective coefficient of thermal expansion of the adjustment device $$\alpha_V = \frac{s_1}{f} \cdot \left[\alpha_L - \frac{1}{n-1} \cdot \left(\frac{\partial n}{\partial \lambda} \cdot \frac{d\lambda}{dT} + \frac{\partial n}{\partial T}\right)\right] + \alpha_2 \cdot \left(1 - \frac{s_1}{f}\right)$$

This is envisaged in accordance with the invention.

For example, the lens may consist of a first plastic PC with $$\alpha_L = 70 \cdot 10^{-6}/K, n = 1.579, \frac{\partial n}{\partial T} = 107 \cdot 10^{-6}/K \text{ and } \frac{\partial n}{\partial \lambda} = -0.07/\mu m.$$

The lens may have a focal length f=5 mm, and it may be that an object distance $s_1$=7 mm and an image distance $s_2$=17.5 mm. The housing may consist of a second plastic, a blackened PC with $\alpha_2$=70·10$^{-6}$/K. The laser diode may have a wavelength of 650 nm with a temperature dependence $$\frac{d\lambda}{dT} = 0.30 \text{ nm/K}.$$

In this example, according to the invention, it would be necessary to provide an effective coefficient of thermal expansion of the adjustment device $\alpha_V$=380·10$^{-6}$/K.

In the case of a thick lens, the object distance $s_1$ and the image distance $s_2$ may each be reported in a known manner with regard to the object-side/image-side main plane of the lens. In the approximation of a thin lens, it is possible to assume a common main plane since the object-side and image-side main planes approximately coincide.

The device of the invention, in an advantageous embodiment, may be characterized in that the optical image has an image distance $s_2$ greater than five times the object distance 5·$s_1$. The imaging operation may thus be an enlargement. The device of the invention may likewise advantageously be characterized in that the optical image has an image distance $s_2$ less than twenty times the object distance 20·$s_1$. The image distance may be, for example, between 5 mm and 25 mm.

The laser diode may advantageously be a single-mode laser diode. It can emit laser radiation with a beam quality factor $M^2$<1.3. The laser diode may advantageously be selected from a wavelength range between 600 nm and 800 nm. The central wavelength of the laser diode, depending on the temperature, may change, for example, by 0.25 . . . 0.40 nm/K. The laser radiation may be linear-polarized.

The device of the invention may advantageously be characterized in that the focal point takes the form of an image beam waist having a beam quality factor $M^2$<1.3.

Advantageously, the lens may take the form of an aspherical lens. It may have one or two aspherical faces. As a result, it is possible to obtain the beam quality factor of the laser diode. The lens may be a rotationally symmetrical lens. Alternatively, it is also possible to use an astigmatic lens. In this case, the beam path may be specified in a meridional plane. In the case of a cylindrical lens, this may be the active plane. In general, in the case of an astigmatic lens, it is possible to use the meridional plane having the shortest focal length. The laser diode may have an astigmatism that can be corrected with an astigmatic lens.

The effective coefficient of thermal expansion of the adjustment device may be $\alpha_V$>100 μm/(m·K).

The adjustment device may comprise a first stretcher having a coefficient of thermal expansion $\alpha_a$>50 μm/(m·K). Advantageously, the coefficient of expansion of the first stretcher may be greater than the coefficient of thermal expansion $\alpha_2$ of the housing.

Advantageously, the length $l_a$ of the first stretcher may be greater than the object length $s_1$. It is also possible for the adjustment device to comprise a second stretcher (14) that counteracts the first stretcher and has a lower coefficient of thermal expansion $\alpha_b$<$\alpha_a$. It may advantageously be the case that $\alpha_b$<20 μm/(m·K). The second stretcher may have a length $l_b$. The length $l_b$ may be shorter than the length $l_a$ by about the distance $s_1$. The first stretcher may consist of a third plastic. The second stretcher may consist of a fourth plastic, a glass, a ceramic, for example $Al_2O_3$, ZrO or a metal. The combination of the two structures can achieve a coefficient of thermal expansion above that of the first stretcher. The effective coefficient of thermal expansion of the adjustment device may be $$\alpha_V = \frac{l_a \cdot \alpha_a - \cdot l_b \cdot \alpha_b}{s_1}.$$

The first stretcher and/or second stretcher may be in tubular form.

The third plastic may advantageously, for example, be PS, PVC, PET, PADC, PC, PMMA, PEEK, PE, PP, PSU, COP or a synthetic resin, e.g. phenolic resin, urea resin, melamine resin, polyester resin or epoxy resin. The third plastic may have been modified to absorb light and/or colored with the aid of admixtures, for example carbon or dye.

The fourth plastic may advantageously, for example, be liquid-crystal polymer (LCP), PS, PVC, PET, PADC, PC, PMMA, PEEK, PE, PP, PSU COP or a synthetic resin, e.g. phenolic resin, urea resin, melamine resin, polyester resin or epoxy resin. The fourth plastic may have been modified to absorb light and/or colored with the aid of admixtures, for example carbon or dye. Likewise advantageously, the fourth plastic may have been reinforced with fibers and/or filled with ceramic particles. In this way, it is possible to lower the coefficient of thermal expansion $\alpha_b$ compared to the starting material. Advantageous fibers may be aramid, glass or carbon fibers.

The device of the invention may have been athermalized at least within a temperature range from −40° C. to +85° C. Advantageously, the third plastic may have a glass transition temperature above the maximum temperature of the temperature range specified. Particularly advantageously, the first and second plastics may also have a glass transition temperature above the maximum temperature of the temperature range specified.

It may be advantageous to use a device (1) of the invention for illuminating a sample for the purpose of conducting a measurement of a physical or technical parameter. The parameter to be measured may, for example, be the rotation of the plane of polarization of the light, the absorption of a sample at a particular wavelength of light, the scatter of the light at inhomogeneities or particles present in the sample, the size or number of particles in a sample, or the intensity of fluorescence radiation of a sample.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

SOLE FIGURE

The present invention will become more fully understood from the detailed description given hereinbelow and the accompanying drawing which is given by way of illustration only, and thus, is not limitive of the present invention, and wherein the sole FIGURE illustrates a first working example.

WORKING EXAMPLES

The invention is elucidated hereinafter by a working example.

The device (1) shown for generating laser radiation concentrated to a focal point (9) comprises
a laser diode (3) having a central wavelength λ and a temperature dependence of the central wavelength $$\frac{d\lambda}{dT},$$

a lens (8) having a focal length f, made of a first plastic having a refractive index n, a wavelength dependence on the refractive index $$\frac{\partial n}{\partial \lambda},$$

a temperature dependence of the refractive index $$\frac{\partial n}{\partial T}$$

and a coefficient of thermal expansion $\alpha_L$, wherein the lens results in an optical image of the laser radiation at the focal point (9) and the optical image has an object distance $s_1$,
a housing (11) made of a second plastic having a coefficient of thermal expansion $\alpha_2$
a passive adjustment device (12) having an effective coefficient of thermal expansion $\alpha_V$ for adjustment of the object distance $s_1$, wherein the effective coefficient of thermal expansion is $$\alpha_V = \frac{s_1}{f} \cdot \left[ \alpha_L - \frac{1}{n-1} \cdot \left( \frac{\partial n}{\partial \lambda} \cdot \frac{d\lambda}{dT} + \frac{\partial n}{\partial T} \right) \right] + \alpha_2 \cdot \left( 1 - \frac{s_1}{f} \right).$$

The device has an optical axis 2. The laser diode comprises a laser diode housing 4, in which there is disposed a laser diode chip 5. The front of the laser diode housing 4 is equipped with a window from which the laser radiation 7 exits. The electrical contacts of the laser diode are made by means of contact pins 6. The laser diode emits a bundle of rays 7 which is concentrated to a focal point 9 by means of the lens 8. The focal point is represented as a Gaussian beam waist in the diagram. The focal point is within a measurement volume 10 that may take the form of a measurement chamber connected to or integrated into the housing 11.

Also present is an adjustment device (12) comprising a first stretcher (13) having a coefficient of thermal expansion $\alpha_a$>50 μm/(m·K) and a second stretcher (14) that counteracts the first stretcher and has a coefficient of thermal expansion $\alpha_b$<20 μm/(m·K). The first stretcher consists of a third plastic.

The measurement volume 10 may be intended to accommodate a sample for the purpose of conducting a measurement of a physical or technical parameter. The parameter to be measured may, for example, be the rotation of the plane of polarization of the light, the absorption of the sample at a particular wavelength of light, the scatter of the light at inhomogeneities or particles present in the sample, the size or number of particles in the sample, or the intensity of fluorescence radiation from the sample. The light scatter to be measured may be classical scatter, Mie scatter or Rayleigh scatter.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for generating laser radiation concentrated to a focal point, comprising:
    a laser diode having a central wavelength λ and a temperature dependence of the central wavelength $$\frac{d\lambda}{dT},$$

a lens having a focal length f, made from a first plastic having a refractive index n, a wavelength dependence of the refractive index $$\frac{\partial n}{\partial \lambda},$$

a temperature dependence of the refractive index $$\frac{\partial n}{\partial T}$$

and a coefficient of thermal expansion $\alpha_L$, wherein the lens results in an optical image of the laser radiation at the focal point and the optical image has an object distance $s_1$, a housing made of a second plastic having a coefficient of thermal expansion $\alpha_2$, and a passive adjustment device having an effective coefficient of thermal expansion $\alpha_V$ for adjusting the object distance $s_1$, wherein the effective coefficient of thermal expansion is $$\alpha_V = \frac{s_1}{f} \cdot \left[\alpha_L - \frac{1}{n-1} \cdot \left(\frac{\partial n}{\partial \lambda} \cdot \frac{d\lambda}{dT} + \frac{\partial n}{\partial T}\right)\right] + \alpha_2 \cdot \left(1 - \frac{s_1}{f}\right).$$

2. The device as claimed in claim 1, wherein the optical image has an image distance $s_2$ greater than five times the object distance $5 \cdot s_1$.

3. The device as claimed in claim 1, wherein the laser diode emits laser radiation with a beam quality factor $M^2 < 1.3$.

4. The device as claimed in claim 1, wherein the focal point takes the form of an image beam waist having a beam quality factor $M^2 < 1.3$ and/or in that the lens takes the form of an aspherical lens.

5. The device as claimed in claim 1, wherein the effective coefficient of thermal expansion of the adjustment device $\alpha_V > 100\ \mu m/(m \cdot K)$.

6. The device as claimed in claim 1, wherein the adjustment device has a first stretcher having a coefficient of thermal expansion $\alpha_a > 50\ \mu m/(m \cdot K)$ and a second stretcher that counteracts the first stretcher and has a coefficient of thermal expansion $\alpha_b < 20\ \mu m/(m \cdot K)$, and in that the first stretcher consists of a third plastic.

7. The device as claimed in claim 1, wherein it has been athermalized at least within a temperature range from $-40°$ C. to $+85°$ C. and/or in that a third plastic has a glass transition temperature above that temperature range.

8. The device as claimed in claim 1, wherein the device illuminates a sample for a purpose of conducting a measurement of a physical or technical parameter.

* * * * *